United States Patent [19]

Dietrich et al.

[11] Patent Number: 4,812,019
[45] Date of Patent: Mar. 14, 1989

[54] METHOD FOR PRODUCING THE FIRST DIFFERENTIAL OF A TWO-DIMENSIONAL IMAGE AND OPTICAL STRUCTURAL ELEMENT FOR PERFORMING THE METHOD

[75] Inventors: Klaus Dietrich; Anton Harasim, both of Munich, Fed. Rep. of Germany

[73] Assignee: Messerschmitt-Boelkow-Blohm GmbH, Munich, Fed. Rep. of Germany

[21] Appl. No.: 775,594

[22] Filed: Sep. 13, 1985

[30] Foreign Application Priority Data

Sep. 19, 1984 [DE] Fed. Rep. of Germany ....... 3434388

[51] Int. Cl.$^4$ .......................... G02F 1/01; G02F 1/135
[52] U.S. Cl. ..................... 350/355; 350/332; 350/342
[58] Field of Search ............... 350/355, 354, 393, 356, 350/336, 332, 342

[56] References Cited

U.S. PATENT DOCUMENTS

| | | | |
|---|---|---|---|
| 3,502,875 | 3/1970 | Ploss et al. | 250/83.3 |
| 3,932,025 | 1/1976 | Lakatos et al. | 350/393 |
| 4,619,501 | 10/1986 | Armitage | 350/356 |
| 4,643,533 | 2/1987 | Armitage | 350/354 |

FOREIGN PATENT DOCUMENTS 2713718 11/1977 Fed. Rep. of Germany .
2826195 12/1978 Fed. Rep. of Germany .

OTHER PUBLICATIONS

D. G. Schueler and W. D. Smith, "Self-Limiting Electrooptic Variable Density Filters", 1973 Wescon Technical Papers, Western Electric Show, Sep. 1973, vol. 17.

Primary Examiner—Eugene R. LaRoche
Assistant Examiner—Nathan W. McCutcheon
Attorney, Agent, or Firm—W. G. Fasse; D. H. Kane, Jr.

[57] ABSTRACT

For producing the first differential of a two-dimensional optical image, an image of electrical charges corresponding to the brightness distribution of the image is produced in a first layer of an optical structural element. The first, electrical charges storing layer includes a plurality of light sensitive detector elements arranged in a mosaic-type pattern ($D_i$). The electrical charge image representing the brightness distribution is converted into a transmissivity or transparency distribution corresponding to the potential differences across said detector elements in the first layer, by a second layer made of a material (M) that is electro-optically modulatable for changing the transparency or degree of transparency.

10 Claims, 2 Drawing Sheets

D₆ are separated from each other by a distance d.
METHOD FOR PRODUCING THE FIRST DIFFERENTIAL OF A TWO-DIMENSIONAL IMAGE AND OPTICAL STRUCTURAL ELEMENT FOR PERFORMING THE METHOD

FIELD OF THE INVENTION

The invention relates to a method of producing the first differential of a two-dimensional image and to an optical structural element for performing the method. Such element acts as an optical contour filter.

BACKGROUND OF THE INVENTION

Certain problems in connection with image processing, for example in an object recognition, require that the image is differentiated whereby the first differential of a two-dimensional image must be generated. Satisfying such a requirement corresponds to a high-pass filtration of the local image frequencies, whereby the contour contrast is accentuated or raised.

A digital method is known for producing the first image differential wherein the image is digitized and the first differential is calculated in a computer. This approach requires a substantial expenditure of time and costs. Therefore, this digital method is hardly suitable for real-time applications.

Furthermore, the use of a coherent optical image processing is also known, wherein a high-pass filtration can be performed in a real-time at the speed of light. However, this method is also relatively expensive and requires further expenditures for its spacial requirements, so that it cannot be used in small flying bodies or in small aircraft.

OBJECTS OF THE INVENTION

In view of the above it is the aim of the invention to achieve the following objects singly or in combination:

to provide an economical, space-saving, and fast method for generating the first differential of a two-dimensional image;

to construct a small, lightweight, inexpensive, and fast operating opto-electrical structural element for performing this differentiating method; and to provide an optical contour filter which performs the contour filtration in real-time and that can be inserted in an optical system as an optical element, even in existing optical equipment.

SUMMARY OF THE INVENTION

These objects are accomplished according to the invention in that an image of electrical charges corresponding to the brightness distribution of the image, is produced in a first layer of an optical structural element comprising light sensitive detector elements arranged next to each other in a mosaic-like fashion, and that this electrical charge image is converted into a transmissivity distribution corresponding to the potential differences in the first layer, by a second layer comprising a material that is electro-optically sensitive and hence modulatable in its transmissivity or rather in the degree of its transparency between a substantially complete transparency on the one hand and opaqueness on the other hand.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
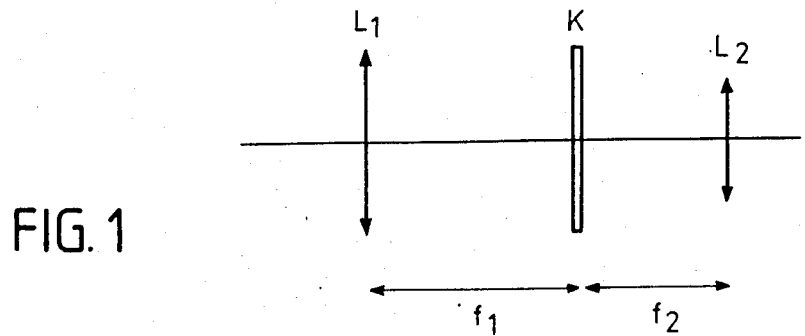
FIG. 1 shows schematically the location of an optical contour filter according to the invention, in an optical system.

FIG. 1 shows schematically the arrangement of an optical contour filter K according to the invention in an optical system, such as a telescope, comprising an object $L_1$ with a focal length $f_1$ and an ocular or eyepiece $L_2$ with a focal length $f_2$. The structural element or optical contour filter K of the invention is inserted in the intermediate image plane between $L_1$ and $L_2$ in this telescope. The image to be processed is initially projected onto the side of the contour filter K facing the objective $L_1$. The filtered image results on the second ocular facing side or surface of the contour filter K. By introducing this structural element in the plane of the intermediate image, the observer does not see the normal image, but rather directly sees a contour image.

A substantial advantage of the method according to the invention and of the structural elements suitable for performing the present method, as compared to other methods and structural elements, is seen in that the optical contour filter elements according to the invention can be inserted in previously existing optical systems just as any other optical component and including presently available optical systems and can also be readily removed from the system.

Figure 2:
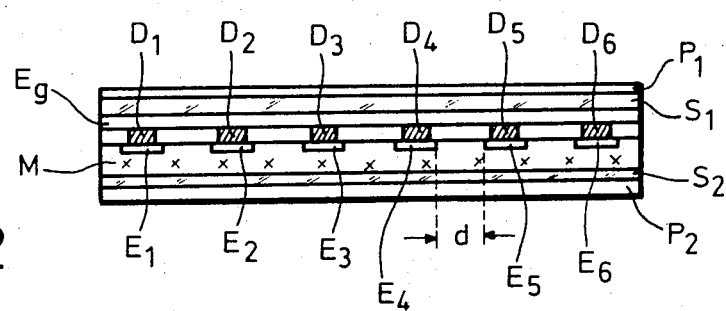
FIG. 2 schematically illustates the construction of an optical contour filter with a longitudinal electrode arrangement in a one-dimensional example representing a linear or line filter.

A structural optical element is constructed as shown in FIG. 2. The present device may be constructed as a so-called one-dimensional or linear structure or it may be constructed as a two-dimensional or plane structure. A first layer in the present element comprises a mosaic-type detector array of light sensitive elements $D_1 \ldots D_6$. The array interacts with an electro-optically sensitive or active material M in a second layer or layer structure. The discrete, individual detector elements $D_1 \ldots D_6$ are separated from each other by a distance d. The entire element is optically transparent between the detector elements $D_1 \ldots D_6$. A discrete electrode $E_1 \ldots E_6$ is arranged for cooperation with each detector element $D_1 \ldots D_6$. A transparent common electrode $E_g$ is operatively connected to each of the detector elements $D_1 \ldots D_6$. The present structural element is built up on substrate plates $S_1$ and $S_2$. Both sides are normally sealed with a respective polarizing filter $P_1$ and $P_2$.

In response to incident light, a photo-potential arises in each detector element $D_1 \ldots D_6$ between the common electrode $E_g$ and each corresponding detector electrode $E_1 \ldots E_6$. The electro-optically active or sensitive material M in the second layer and the polarizing filters $P_1$ or $P_2$ are selected so that during homogeneous illumination through the optical element, the present element is either completely transparent (Case A) or completely opaque (Case B). If two neighboring light sensitive detector elements $D_i$ and $D_{i+1}$, of the structural component or element are illuminated each with a different intensity, then a potential difference arises between the detector electrodes $E_i$ and $E_{i+1}$ of the two detector elements. This potential difference alters the optical characteristics of the electro-optically active layer M so that the structural element becomes opaque in this area in said Case A or light-transmissive or transparent in this area in Case B. If a linear electro optically active material is used in the second layer M, the change in light transmission or transparency will be proportional to the local gradient of the incident light intensity.

Either liquid crystals or electro-optically active ceramics, for example, can be uilized as the electro-optically active material for the second layer M in this structural element or component. (i.e. nematic, cholesteric, ferroelectric liquid crystals (MERCK/DARMSTADT ZLI 1779, ZLI 1275, ZLI 2274, ZLI 1779+x%CB15, ZLI 3079, ZLI 3080) or PLZT ceramic (SEL,STUTTGART). Photoconductors in which the electrical resistance corresponds to the intensity of the incident light or barrier photodetectors, also called photoelements, are suitable for use as light sensitive detector elements $D_1 \ldots D_6$.

So-called photoelements have the advantage that the potential of the photoelement remains proportional to the logarithm of the incident light intensity over many decades, so that in this structural element the modulation of the electro-optical material in the second layer M is not dependent on the incident light intensity over an equal number of decades and is only dependent on the local intensity gradient.

Figure 3:
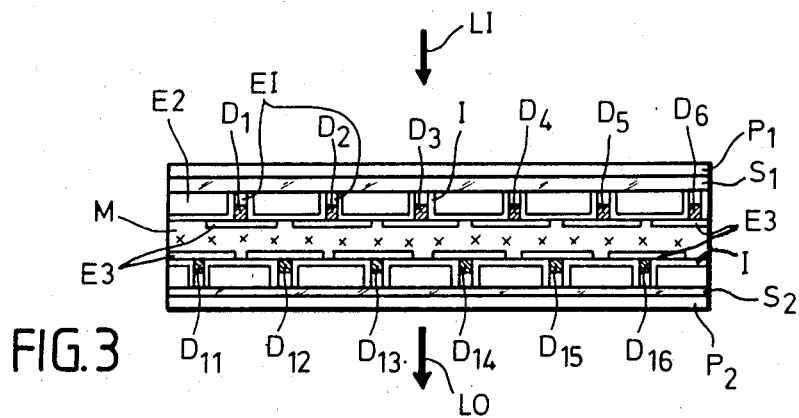
FIG. 3 shows a section through a two-dimensional optical contour filter of the invention.
Figure 3A:
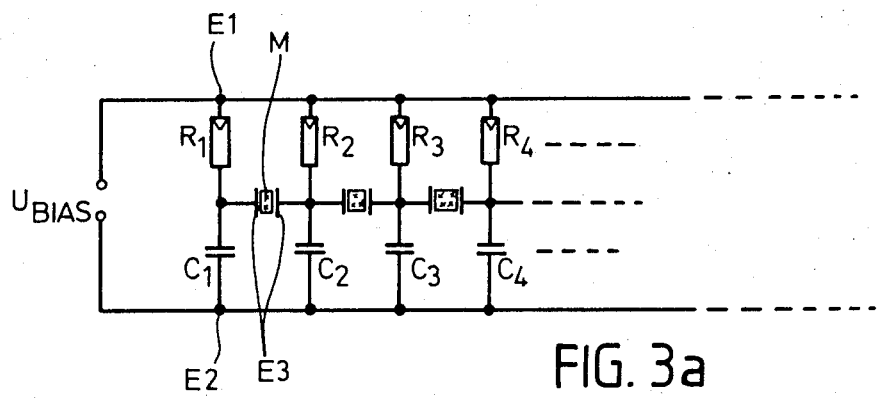
FIG. 3a shows an equivalent circuit diagram of the filter of FIG. 3.

FIG. 3 shows the typical construction of such a structural component or element for a two-dimensional or areal or plane contour filter. The circuit diagram equivalent of the contour filter of FIG. 3 is shown in FIG. 3a. Photoresistors $R_i$ are used as detector elements. The capacitors $C_i$ are formed by the dielectric material of the insulating layer I and by the electrodes $E_2$ and $E_3$. The capacitors $C_i$ are charged by means of an alternating voltage $U_{BIAS}$ applied to the electrodes $E_1$ and $E_2$ to a charge corresponding to an alternating voltage having an amplitude depending on the light intensity incident on the detectors $D_i$, or rather, on the respective photoresistor $R_i$. If the light intensity is equal on all detectors $D_i$, then the same alternating voltage or potential will arise in all of the capacitors $C_i$, so that no voltage is applied to the second layer M of electro optically active material (M) between the electrodes $E_3$ of the adjacent image or rather light sensitive detector elements. FIG. 3 shows that, for example, the electrodes $E_3$ in the upper row are staggered relative to the same type of electrodes $E_3$ in the lower row. Similarly, the light sensitive detector elements $D_1$ to $D_6$ are staggered relative to the light sensitive detector elements $D_{11}$ to $D_{16}$.

If the light intensity of the incident light LI is different on two adjacent detectors $D_i$, or rather on two adjacent photoresistors $R_i$, then the potential in the corresponding capacitors $C_i$ is also different, so that an alternating voltage or potential acts on the second layer of elecro optically active material M between the electrodes $E_3$ of these detector elements, thereby altering the optical characteristics of the electro optically active material at the respective spot. By a suitable choice of electro optically active material M and possibly also of the polarizers $P_1$ and $P_2$, on the front and back of the optical structural element, if such polarizers are used, it can be achieved that during a homogeneous illumination of the structural element, it becomes completely opaque (Case B) or completely transparent (Case A). During inhomogeneous illumination of the structural element, it then becomes increasingly transparent or opaque depending upon the illumination gradient. The emerging light or output light LO is correspondingly modulated, and visible through the ocular $L_2$.

Figures 3B, 3C:
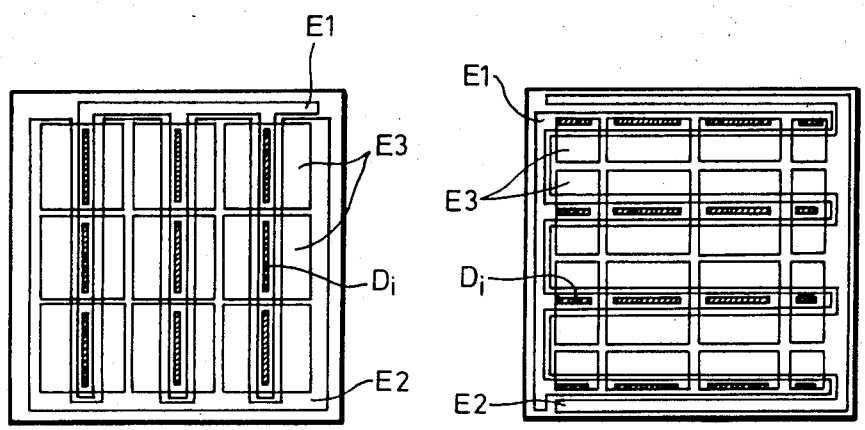
FIG. 3b shows a plan view onto the top substrate, or rather cover plate, of the filter of FIG. 3.
FIG. 3c shows a plan view onto the lower substrate or base plate of the filter of FIG. 3.

The layer construction of the present optical structural element is shown in FIG. 3. The arrangement of the light sensitive detector elements $D_i$ is shown on the upper and lower substrates in FIGS. 3b and 3c, respectively. The field strength E that essentially modulates the electro-optically active material M arises longitudinally to the incident light LI in the arrangement of FIG. 3, in other words, the field strength E extends in parallel to the incident light LI. This is in contrast to the transverse arrangement of FIG. 2.

Figure 4:
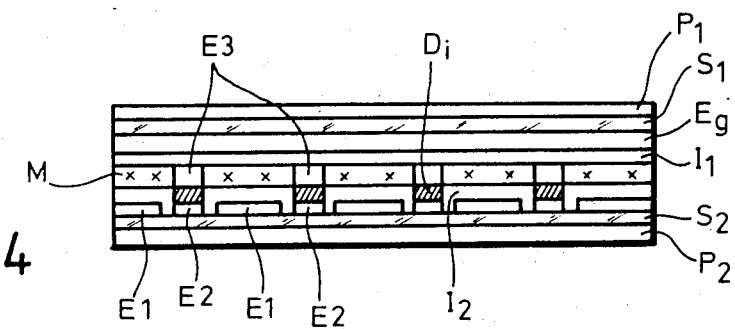
FIG. 4 shows the construction of another optical contour filter of the invention with a transverse electrode arrangement.

A second example of a transverse arrangement of an optical element or component is shown in FIG. 4, wherein the detector elements $D_i$ comprise light sensitive resistors. An alternating potential or voltage between the electrodes $E_1$ and $E_2$ is required to drive this optical structural element. The method of operation corresponds to the circuit diagram in FIG. 3a. The capacitors $C_i$ comprise the dielectric of the isolation layer $I_2$ and the electrodes $E_2$ and $E_1$.

Although the invention has been described with reference to specific example embodiments, it will be appreciated that it is intended to cover all modifications and equivalents within the scope of the appended claims.

What I claim is:

1. An optical contour filter for differentiating a two-dimensional image represented by incident light, comprising a plurality of discrete light sensitive detector elements arranged in a mosaic fashion to form a detector array for receiving said incident light, a layer (M) of electro-optically active material capable of changing its transparency in response to an influence, said layer of electro-optically active material being arranged for cooperation with said detector array for displaying a differentiated contour image of said two-dimensional image, electrode means including discrete electrode elements each cooperating with its respective light sensitive detector element for generating a potential difference between neighboring electrode elements in response to a change in the intensity of the light incident on neighboring discrete light sensitive detector elements, said potential difference causing a change in said transparency of said electro-optically active material, so that said contour filter directly provides at its output a differentiated contour image.

2. The optical contour filter of claim 1, wherein said detector array of discrete light sensitive detector elements comprises discrete photoconductor elements forming said array.

3. The optical contour filter of claim 1, wherein said detector array of discrete light sensitive detector elements is a layered structure comprising a barrier layer and a photodetector layer arranged for cooperation with each other.

4. The optical contour filter of claim 1, wherein said layer (M) of electro-optically active material comprises an electro-optically active ceramic material.

5. The optical contour filter of claim 1, wherein said layer (M) of electro-optically active material is a liquid crystal layer.

6. The optical contour filter of claim 1, wherein said electrode means comprise transparent electrode means, said discrete light sensitive detector elements being arranged on said transparent electrode means for controlling said layer (M) of electro-optically active material.

7. The optical contour filter of claim 1, wherein said electrode means comprise transparent common electrode means for all of said light sensitive detector elements, and wherein each of said discrete electrode elements is individually located for said cooperating with a respective one of said discrete light sensitive detector elements, and wherein said discrete electrode elements are so arranged relative to said layer (M) of electro-optically active material that potential differences occurring between said discrete electrode elements modulate the transparency of said layer (M) of electro-optically active material for directly producing said differentiated contour image.

8. The optical contour filter of claim 7, further comprising insulating means between said common electrode means and said discrete electrode elements for forming capacitors, and wherein said light sensitive detector elements are photoresistors, said capacitors ($C_i$) having a charge state in response to an applied alternating voltage ($U_{BIAS}$) depending upon a resistance value of said photoresistors, said charge state modulating a voltage between two neighboring electrodes acting on said layer (M) of electro-optically active material.

9. The optical contour filter of claim 1, wherein said electrode means comprise electrode elements arranged in a staggered relationship relative to each other.

10. The optical contour filter of claim 1, wherein said light sensitive detector elements comprise at least two arrays of detector elements which are staggered relative to each other.

* * * * *